United States Patent
Lee et al.

(10) Patent No.: US 10,529,755 B2
(45) Date of Patent: Jan. 7, 2020

(54) IMAGE SENSOR HAVING A PHOTOELECTRIC CONVERSION LAYER COUPLED TO A STORAGE NODE THROUGH A PINNING LAYER WITH P-TYPE IMPURITIES

(71) Applicant: SAMSUNG ELECTRONICS CO., LTD., Suwon-si, Gyeonggi-do (KR)

(72) Inventors: Tae Yon Lee, Seoul (KR); Gwi Deok Lee, Suwon-si (KR); Masaru Ishii, Hwaseong-si (KR); Young Gu Jin, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/704,690

(22) Filed: Sep. 14, 2017

(65) Prior Publication Data
US 2018/0190699 A1    Jul. 5, 2018

(30) Foreign Application Priority Data
Jan. 4, 2017  (KR) .................. 10-2017-0001228

(51) Int. Cl.
*H01L 27/146* (2006.01)
*H01L 27/148* (2006.01)
(Continued)

(52) U.S. Cl.
CPC .... *H01L 27/14614* (2013.01); *H01L 27/1461* (2013.01); *H01L 27/14616* (2013.01);
(Continued)

(58) Field of Classification Search
CPC .......... H01L 27/14603–14607; H01L 27/14609–14616; H01L 27/14636;
(Continued)

(56) References Cited

U.S. PATENT DOCUMENTS 8,368,784 B2  2/2013  Yamaguchi
8,450,728 B2  5/2013  Yamaguchi
(Continued)

FOREIGN PATENT DOCUMENTS

WO    2016039152    3/2016

OTHER PUBLICATIONS

M. Takase, et al., "First demonstration of 0.9 um pixel global shutter operation by novel charge control in organic photoconductive film," IEEE 2015, pp. 30.2.1-30.2.4.*

*Primary Examiner* — Younes Boulghassoul
(74) *Attorney, Agent, or Firm* — F. Chau & Associates, LLC

(57) ABSTRACT

An image sensor includes a first photoelectric conversion layer that is configured to convert light to a first signal. The image sensor also includes a transfer transistor. The transfer transistor includes a storage node region which stores the first signal. The transfer transistor also includes a transfer gate which transfers the stored first signal, and a floating diffusion region that receives the first signal. The image sensor includes a reset transistor that resets the floating diffusion region, and a drive transistor which receives a pixel voltage. The drive transistor generates an output voltage. The image sensor also includes a selection transistor which outputs the output voltage. A reset drain voltage is applied to a drain electrode of the reset transistor, and is independent of the pixel voltage. The reset drain voltage ranges from about 0.1V to about 1.0V.

6 Claims, 11 Drawing Sheets

(51) Int. Cl.
  *H04N 5/3745* (2011.01)
  *H04N 5/361* (2011.01)
  *H04N 5/378* (2011.01)
  *H04N 5/369* (2011.01)

(52) U.S. Cl.
  CPC .. *H01L 27/14638* (2013.01); *H01L 27/14667* (2013.01); *H01L 27/14689* (2013.01); *H01L 27/14812* (2013.01); *H04N 5/361* (2013.01); *H04N 5/378* (2013.01); *H04N 5/379* (2018.08); *H04N 5/37452* (2013.01); *H04N 5/37457* (2013.01)

(58) Field of Classification Search
  CPC ......... H01L 27/14638; H01L 27/14621; H01L 27/14643–14647; H01L 27/14665–14667; H01L 27/307; H04N 5/361; H04N 5/378; H04N 5/3575; H04N 5/363; H04N 5/3591–3594
  See application file for complete search history.

(56) References Cited

U.S. PATENT DOCUMENTS

| | | |
|---|---|---|
| 8,471,313 B2 | 6/2013 | Takahashi |
| 8,704,927 B2 | 4/2014 | Mabuchi |
| 8,907,262 B2 | 12/2014 | Yamaguchi |
| 9,287,302 B2 | 3/2016 | Egawa |
| 9,287,327 B2 | 3/2016 | Lee et al. |
| 9,443,896 B2 | 9/2016 | Hirase |
| 2013/0313410 A1* | 11/2013 | Goto .................... H04N 5/3698 250/208.1 |
| 2015/0001663 A1* | 1/2015 | Lee ................... H01L 27/14627 257/432 |
| 2015/0041865 A1* | 2/2015 | Storm .................... H04N 5/355 257/229 |
| 2016/0035794 A1 | 2/2016 | Kim et al. |
| 2016/0133865 A1 | 5/2016 | Yamaguchi |
| 2016/0240571 A1 | 8/2016 | Baek |
| 2016/0329375 A1* | 11/2016 | Imoto ................. H01L 27/1463 |
| 2017/0019618 A1* | 1/2017 | Koga ................. H04N 5/37455 |
| 2018/0027197 A1* | 1/2018 | Lee ........................ H04N 5/361 250/208.1 |

* cited by examiner

IMAGE SENSOR HAVING A PHOTOELECTRIC CONVERSION LAYER COUPLED TO A STORAGE NODE THROUGH A PINNING LAYER WITH P-TYPE IMPURITIES

CROSS-REFERENCE TO RELATED APPLICATION

This application claims priority under 35 USC § 119 to Korean Patent Application No. 10-2017-0001228, filed on Jan. 4, 2017, in the Korean Intellectual Property Office, the disclosure of which is incorporated herein in its entirety.

TECHNICAL FIELD

Example embodiments of the present inventive concept relates to an image sensor.

DISCUSSION OF THE RELATED ART

Image sensors may convert optical images into electrical signals, and recently, demand for high performance image sensors has been on the rise in various fields, for example, digital cameras, camera-recorders, personal communication systems (PCSs), game consoles, surveillance cameras, and medical micro-cameras, etc.

Image sensors may include charge coupled devices (CCDs) and complementary metal-oxide semiconductor (CMOS) image sensors. Among these image sensors, CMOS image sensors can be conveniently driven, and can be made smaller in size since signal processing circuits may be integrated into a single chip. In addition, CMOS image sensors are more power efficient and thus are more suitable for products with a limited battery capacity. Furthermore, CMOS image sensors can use a compatible CMOS process technology, resulting in reduced manufacturing cost.

SUMMARY

According to an exemplary embodiment of the present inventive concept, an image sensor includes a first photoelectric conversion layer which is disposed on a substrate. The first photoelectric conversion layer is configured to convert light received on the first photoelectric conversion layer to a first signal. The image sensor further includes a transfer transistor, and the transfer transistor includes a storage node region which is connected to the first photoelectric conversion layer and configured to store the first signal, a transfer gate configured to transfer the first signal in the storage node region based on a transfer signal, and a floating diffusion region configured to receive the first signal in the storage node region by the transfer gate. The image sensor still further includes a reset transistor configured to reset the floating diffusion region based on a reset signal. The image sensor further includes a drive transistor which receives a pixel voltage, and is configured to generate an output voltage based on the floating diffusion region. The image sensor further includes a selection transistor configured to output the output voltage based on a selection signal. A reset drain voltage is applied to a drain electrode of the reset transistor, and the reset drain voltage is independent of the pixel voltage. The reset drain voltage ranges from about 0.1V to about 1.0V.

According to an exemplary embodiment of the present inventive concept, an image sensor includes an active pixel sensor array including a first pixel. The image sensor further includes a substrate on which the active pixel sensor array is disposed. The substrate includes a first surface and a second surface facing each other, and the light is received at the second surface of the substrate. The first pixel includes a first lower electrode which is disposed on the second surface, and is configured to receive a first voltage. The first pixel further includes a first photoelectric conversion layer which is disposed on the first lower electrode. The first pixel further includes an upper electrode which is disposed on the first photoelectric conversion layer, and is configured to receive a second voltage that is higher than the first voltage. The first pixel still further includes a first storage node region, a first floating diffusion region, a reset source region, and a reset drain region that are disposed in the substrate, adjacent to the first surface. The first pixel further includes a first transfer gate which is disposed on the first surface, and interposed between the first storage node region and the first floating diffusion region. The first pixel further includes a reset gate which is disposed on the first surface, and interposed between the reset source region and the reset drain region. The first pixel still further includes a first through via which is disposed through the substrate, and configured to electrically connect the first lower electrode and the first storage node region. The reset source region is electrically connected to the first floating diffusion region, and the reset drain voltage ranges from about 0.1V to about 1.0V.

According to an exemplary embodiment of the present inventive concept, an image sensor includes a unit pixel formed on a substrate. The unit pixel includes a first photoelectric conversion unit, and a first transfer transistor. The first transfer transistor includes a first storage node region, and a first transfer gate. The unit pixel further includes a second photoelectric conversion unit, and a second transfer transistor. The second transfer transistor includes a second storage node region, and a second transfer gate. The unit pixel further includes a floating diffusion region connected to the first and second transfer transistors. The unit pixel further includes a reset transistor configured to reset the floating diffusion region. The unit pixel still further includes a first drive transistor and a second drive transistor connected to the floating diffusion region. The unit pixel includes a selection transistor configured to output an output voltage based on a selection signal.

BRIEF DESCRIPTION OF THE DRAWINGS

The above and other features of the present inventive concept will become more apparent by describing in detail exemplary embodiments thereof, with reference to the accompanying drawings, which.

DETAILED DESCRIPTION OF THE EMBODIMENTS

Exemplary embodiments of the present inventive concept will be described more fully hereinafter with reference to the accompanying drawings. The present disclosure may, however, be embodied in many different forms and should not be construed as limited to the embodiments set forth herein.

Figure 1:
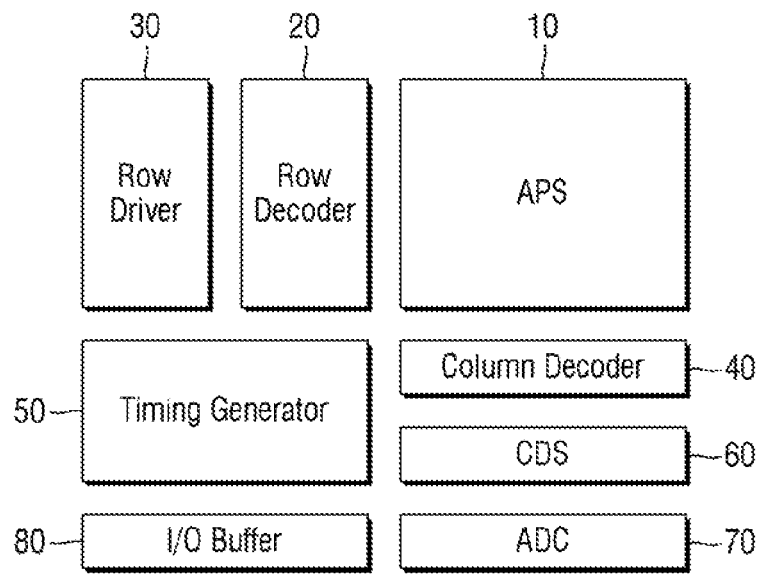
FIG. 1 is a block diagram illustrating an image sensor according to one or more exemplary embodiments of the present inventive concept.

An image sensor according to some embodiments of the present inventive concept will hereinafter be described with reference to FIG. 1 and FIG. 2. FIG. 1 is a block diagram illustrating an image sensor according to one or more embodiments of the present inventive concept.

Referring to FIG. 1, the image sensor according to some embodiments may include an active pixel sensor (APS) array 10, a row decoder 20, a row driver 30, a column decoder 40, a timing generator 50, a correlated double sampler (CDS) 60, an analog-to-digital converter (ADC) 70, and an input/output (I/O) buffer 80.

The active pixel sensor array 10 may include a plurality of unit pixels arranged two-dimensionally, and convert an optical signal into an electrical signal. The active pixel sensor array 10 may be driven by a plurality of driving signals, for example, a selection signal ($S_S$ in, for example, FIG. 3), a reset signal ($S_R$ in, for example, FIG. 3), and a transfer signal ($S_T$ in, for example, FIG. 3) from the row driver 30. Furthermore, the electrical signal converted by the active pixel sensor (APS) array 10 may be provided to the CDS 60.

The row driver 30 may provide a plurality of driving signals for driving a plurality of unit pixels to the active pixel sensor array 10 according to the decoded result of the row decoder 20. When the unit pixels are arranged into a matrix pattern, driving signals may be provided on a per-row basis.

The timing generator 50 may provide a timing signal and a control signal to the row decoder 20 and the column decoder 40.

The CDS 60 may receive the electrical signal generated by the active pixel sensor array 10 so as to hold and perform sampling. The CDS 60 may double sample a reference level including a particular noise and a signal level of an electrical signal, and output a difference level corresponding to a difference between the reference level and the signal level.

The ADC 70 may convert the analog signal corresponding to the difference level output by the CDS 60 into a digital signal, and output the digital signal.

The I/O buffer 80 may latch the digital signal, and output the latched digital signals to an image signal processing unit (not shown) sequentially according to the decoded result of the column decoder 40.

Figure 2:
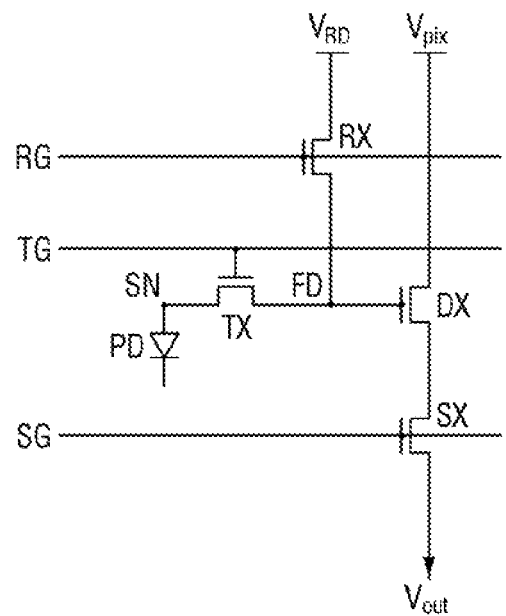
FIG. 2 is a circuit diagram illustrating a unit pixel of the image sensor according to one or more exemplary embodiments of the present inventive concept.

FIG. 2 is a circuit diagram illustrating a unit pixel of the image sensor according to one or more exemplary embodiments of the present inventive concept.

Referring to FIG. 2, the unit pixel of the image sensor according to one or more exemplary embodiments may include a photoelectric conversion unit PD, a transfer transistor TX, and a plurality of logic transistors RX, SX, DX. In this embodiment, the plurality of logic transistors RX, SX, DX may include a reset transistor RX, a selection transistor SX, and a drive transistor DX or a source follower transistor.

The photoelectric conversion unit PD may generate photocharges in proportion to a quantity of incident light from an external source. For example, the photoelectric conversion unit PD may receive light, and convert an optical signal into an electrical signal.

The photoelectric conversion unit PD according to some embodiments may generate holes by incident light from the external source, and convert an optical signal into a first signal, which is an electrical signal, by using the generated holes. In one example, the photoelectric conversion unit PD according to some exemplary embodiments may generate holes and provide the first signal.

The photoelectric conversion unit PD may include, for example, a photo diode, a photo transistor, a photo gate, a pinned photo diode (PPD), an organic photo diode (OPD), a quantum dot (QD), and a combination thereof.

The transfer transistor TX may include a storage node region SN, a floating diffusion region FD, and a transfer gate TG.

The transfer transistor TX may be illustrated as being one in a unit pixel, but the present disclosure is not limited thereto. In another example, the unit pixel may include a plurality of transistors.

For example, the unit pixel may include a plurality of photoelectric conversion units, and transfer gates corresponding respectively to the plurality of photoelectric conversion units. Furthermore, for example, when the unit pixel includes a plurality of transfer transistors, the floating diffusion region FD may be shared.

The storage node region SN may be connected to the photoelectric conversion unit PD, and store an electrical signal. When the photoelectric conversion unit PD generates holes and provides the first signal, the storage node region SN may receive the holes generated by the photoelectric conversion unit PD and store the first signal.

The transfer gate TG may be controlled by the transfer signal ($S_T$ in, for example, FIG. 3), and may transfer the electrical signal stored in the storage node region SN to the floating diffusion region FD. When the photoelectric conversion unit PD generates holes and provides the first signal, the transfer gate TG may transfer the holes stored in the storage node region SN to the floating diffusion region to transfer the first signal.

The floating diffusion region FD may receive the electrical signal stored in the storage node region SN and transferred by the transfer gate TG. When the photoelectric conversion unit PD generates holes and provides the first signal, the floating diffusion region FD may receive the holes stored in the storage node region SN.

The reset transistor RX may reset the electrical signals accumulated in the floating diffusion region FD. When the photoelectric conversion unit PD generates holes and provides the first signal, a source electrode of the reset transistor RX can be connected to the floating diffusion region FD, and a reset drain voltage $V_{RD}$ may be applied to a drain electrode of the reset transistor RX.

In some embodiments, the reset drain voltage $V_{RD}$ may be independent of a pixel voltage $V_{pix}$. For example, the reset drain voltage $V_{RD}$ and the pixel voltage $V_{pix}$ may be applied from different power sources, and thus may be different from each other.

Figure 3:
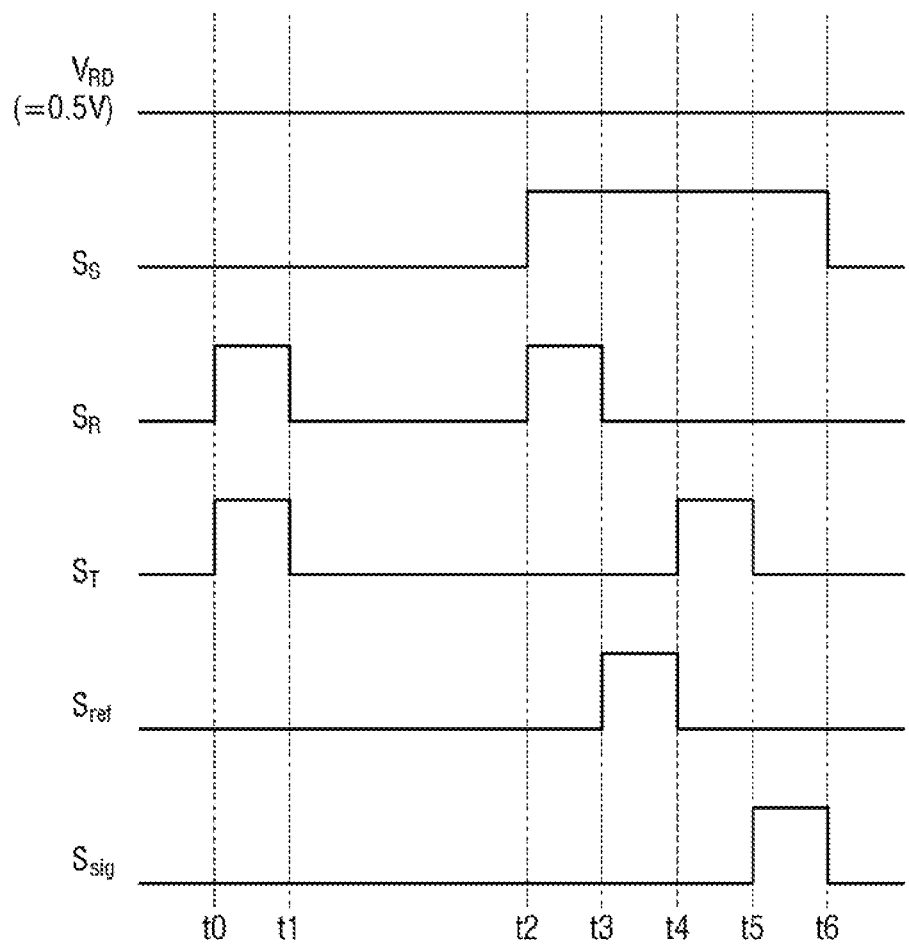
FIG. 3 is a timing diagram illustrating an operation of the image sensor according to one or more exemplary embodiments of the present inventive concept.

The reset transistor RX may include a reset gate RG, and may be controlled by the reset signal ($S_R$ in, for example, FIG. 3). In one example, when the reset transistor RX is turned on by the reset signal ($S_R$ in, for example, FIG. 3), the reset drain voltage $V_{RD}$ applied to the drain electrode of the reset transistor RX may be transferred to the floating diffusion region FD.

In one embodiment, when the photoelectric conversion unit PD generates holes and provides the first signal, the holes provided to the floating diffusion region FD may be discharged to reset the floating diffusion region FD, when the reset transistor RX is turned on.

The drive transistor DX may be combined with a constant current source (not shown) disposed outside the unit pixel so as to serve as a source follower buffer amplifier. Thus, the drive transistor DX may amplify voltage variation in the floating diffusion region FD and generate the amplified voltage variation as an output voltage $V_{out}$. For example, the drive transistor DX may be controlled by the electrical signal provided to the floating diffusion region FD so as to convert the pixel voltage $V_{pix}$ connected to the source electrode of the drive transistor DX to the output voltage $V_{out}$.

In case where the photoelectric conversion unit PD generates holes and provides the first signal, the drive transistor DX can be controlled according to the quantity of holes provided to the floating diffusion region FD. In one example, the pixel voltage $V_{pix}$ can be converted to the output voltage $V_{out}$ according to the quantity of holes provided to the floating diffusion region FD.

The selection transistor SX may select unit pixels to be read on a per-row basis. The selection transistor SX may include a selection gate SG, and may be controlled by the selection signal ($S_S$ in, for example, FIG. 3). When the selection transistor SX is turned on by the selection signal ($S_S$ in, for example, FIG. 3), the output voltage $V_{out}$ generated by the drive transistor DX may be output.

An operation of an image sensor according to some exemplary embodiments of the present inventive concept will hereinafter be described with reference to FIG. 1 to FIG. 5. For convenience of explanation, the part duplicated with those described with reference to FIG. 1 and FIG. 2 will be briefly described or omitted.

Figure 4:
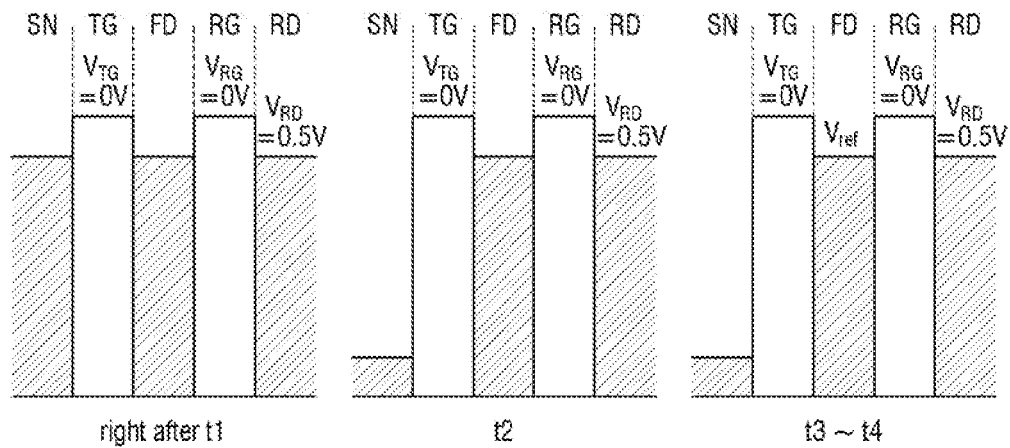
FIG. 4 is a diagram illustrating an operation of the image sensor according to one or more exemplary embodiments of the present inventive concept.
Figure 4:
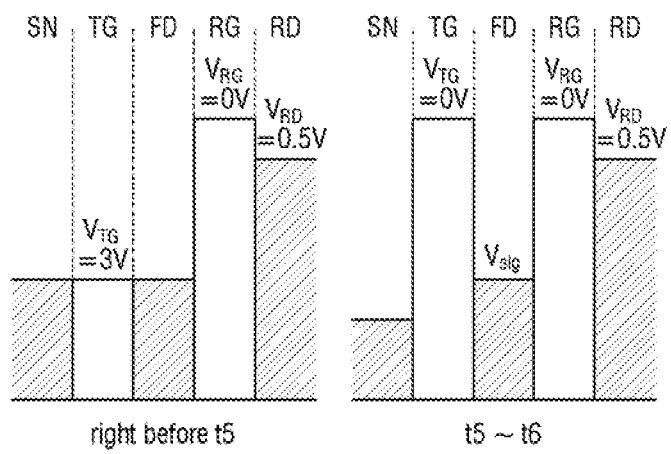
Figure 5:
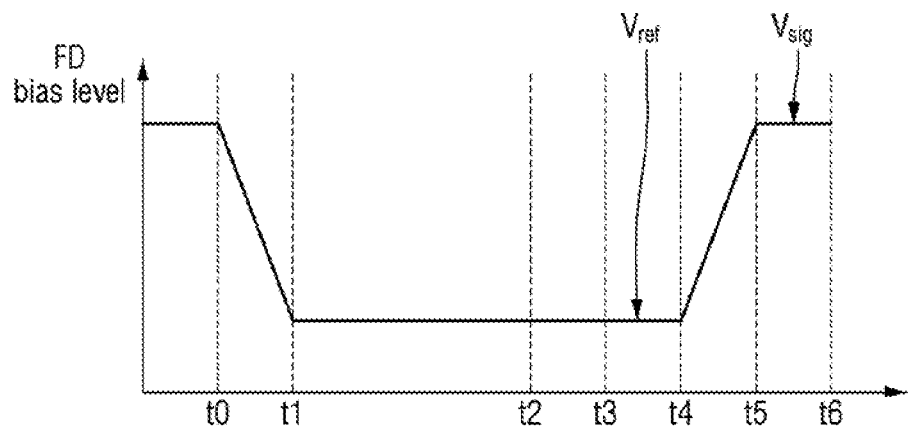
FIG. 5 is a graphical representation illustrating voltage variation in a floating diffusion region according to an operation of the image sensor according to one or more exemplary embodiments of the present inventive concept.

FIG. 3 is a timing diagram illustrating an operation of the image sensor according to one or more exemplary embodiments of the present inventive concept. FIG. 4 is a diagram illustrating an operation of the image sensor according to one or more exemplary embodiments of the present inventive concept. FIG. 5 is a graphical representation illustrating voltage variation in a floating diffusion region FD according to an operation of the image sensor according to one or more exemplary embodiments of the present inventive concept.

Referring to FIG. 3 to FIG. 5, the reset signal $S_R$ and the transfer signal $S_T$ may be activated in a period between t0 and t1. The floating diffusion region FD and the storage node region SN may be reset by the activated reset signal $S_R$ and transfer signal $S_T$, respectively.

For example, a reset gate voltage $V_{RG}$ and a transfer gate voltage $V_{TG}$ may respectively have voltages that are substantially equal to or higher than a threshold voltage by the activated reset signal $S_R$ and transfer signal $S_T$. Thus, a reset drain voltage $V_{RD}$ applied to a reset drain region RD may be transferred to the storage node region SN and the floating diffusion region FD.

Electrons may be transferred from the reset drain region RD to the floating diffusion region FD and the storage node region SN by the transferred reset drain voltage $V_{RD}$. Thus, as shown in FIG. 4, the storage node region SN and the floating diffusion region FD may be filled with the electrons after t1. For example, as shown in FIG. 5, the voltage applied to the floating diffusion region FD may be reduced in the period between t0 and t1.

In some embodiments, the reset transistor RX may be controlled with a reduced voltage. For example, the reset drain voltage $V_{RD}$ may range from about 0.1V to about 1.0V. In one example, the reset drain voltage $V_{RD}$ may range from about 0.3V to about 0.7V.

When the reset drain voltage $V_{RD}$ is substantially equal to or higher than about 0.1V, the reset gate RG can control a reset operation. In one example, when the reset signal $S_R$ and the transfer signal $S_T$ are not activated, no voltage may be applied to the reset gate RG and the transfer gate TG ($V_{RG}$=0V, $V_{TG}$=0V). In this embodiment, when the reset drain voltage $V_{RD}$ is substantially equal to or higher than about 0.1V, transfer of electrons from the reset drain region RD to the storage node region SN and the floating diffusion region FD may be blocked. For example, when the reset drain voltage $V_{RD}$ is substantially equal to or higher than about 0.1V, the reset gate RG may control the reset operation. Furthermore, when the reset drain voltage $V_{RD}$ is substantially equal to or higher than about 0.3V, the reset gate RG may control the reset operation in an easier way than when the reset drain voltage $V_{RD}$ is higher than about 0.1V and less than about 0.3V.

When the reset drain voltage $V_{RD}$ is substantially equal to or lower than about 1.0V, dark current generated in the floating diffusion region FD may be substantially reduced. As the voltage applied to the floating diffusion region FD further increases above about 1.0V, the dark current generated in the floating diffusion region FD may increase. The dark current generated in the floating diffusion region FD may increase random noise of an image sensor. For example, when an increased level of voltage is applied to the floating diffusion region FD, increased level of dark current may be generated in a PN junction part of the floating diffusion region FD, which may increase random noise of the image sensor. For example, if the reset drain voltage $V_{RD}$ is substantially equal to or lower than about 1.0V, the random noise of the image sensor may be reduced. Furthermore, if the reset drain voltage $V_{RD}$ is substantially equal to or lower than about 0.7V, dark current generated in the floating diffusion region FD may be further reduced.

After t2, photoelectric transduction may be performed in the photoelectric conversion unit (PD in, for example, FIG. 2) by incident light from the external source.

In one example, the photoelectric conversion unit PD may generate holes and provide the generated holes to the storage node region SN. The holes provided to the storage node region SN may recombine with the electrons which have filled the storage node region SN. Thus, as shown in FIG. 4, the electrons which have filled the storage node region SN may be reduced in t2. However, since the transfer signal $S_T$ is not activated in the period between t1 and t2 (in, for example, FIG. 3), the electrons which have filled the floating diffusion region FD in t2 may not be reduced, unlike those in the storage node region SN. In one example, as shown in FIG. 5, the voltage applied to the floating diffusion region FD may not change in the period between t1 and t2.

In the period between t2 and t3, the selection signal $S_S$ and the reset signal $S_R$ may be activated. The floating diffusion region FD may be reset by the activated reset signal $S_R$.

In the period between t3 and t4, the selection signal $S_S$ and a reference sampling signal $S_{ref}$ may be activated. Thus, a reference voltage $V_{ref}$, which is the output voltage $V_{out}$ corresponding to the voltage applied to the floating diffusion region FD between t3 and t4, may be sampled.

In one example, the floating diffusion region FD may be reset in the period between t2 and t3, and the reference voltage $V_{ref}$ corresponding to the voltage applied to the reset floating diffusion region FD may be sampled. For example, as shown in FIG. 3-FIG. 5, the reference voltage $V_{ref}$ may be sampled in the period between t3 and t4. In this case, the reference voltage $V_{ref}$ may include a particular noise in a reference condition.

In the period between t4 and t5, the selection signal $S_S$ and the transfer signal $S_T$ may be activated. An electrical signal may be transferred from the storage node region SN to the floating diffusion region FD by the activated transfer signal $S_T$.

In one example, the transfer gate voltage $V_{TG}$ may have a voltage that is substantially equal to or higher than a threshold voltage, and may be applied by the activated transfer signal $S_T$. For example, the transfer gate voltage $V_{TG}$ may be 3V. In this case, electrons may be transferred from the floating diffusion region FD to the storage node region SN. Thus, as shown in FIG. 4, electrons may be reduced in the floating diffusion region FD before t5. For example, as shown in FIG. 5, the voltage applied to the floating diffusion region FD may increase in the period between t4 and t5.

In the period from t5 to t6, the selection signal $S_S$ and a signal sampling signal $S_{sig}$ may be activated. Thus, a signal voltage $V_{sig}$ corresponding to the voltage applied to the floating diffusion region FD after t5 may be sampled.

In one example, the voltage applied to the floating diffusion region FD in the period between t4 and t5 may increase, and the signal voltage $V_{sig}$, which is the output voltage $V_{out}$ corresponding to the increased voltage applied to the floating diffusion region FD, may be sampled. For example, as shown in FIG. 4 and FIG. 5, the signal voltage $V_{sig}$ may be sampled in the period between t5 and t6. In this case, the signal voltage $V_{sig}$ may include a particular noise and image data.

Thus, the CDS 60 (of FIG. 1) may first read the reference voltage $V_{ref}$ after the activated reset signal $S_R$, and then read the signal voltage $V_{sig}$ after the transfer signal $S_T$. The CDS 60 may provide a voltage corresponding to a difference between the reference voltage $V_{ref}$ and the signal voltage $V_{sig}$, and remove noise of the image sensor. For example, the CDS 60 may perform a complete CDS operation.

The image sensor according to one or more exemplary embodiments of the present inventive concept will hereinafter be described with reference to FIG. 6A to FIG. 6C. For convenience of explanation, the part duplicated with those described with reference to FIG. 1 to FIG. 5 will be briefly described or omitted.

Figure 6A:
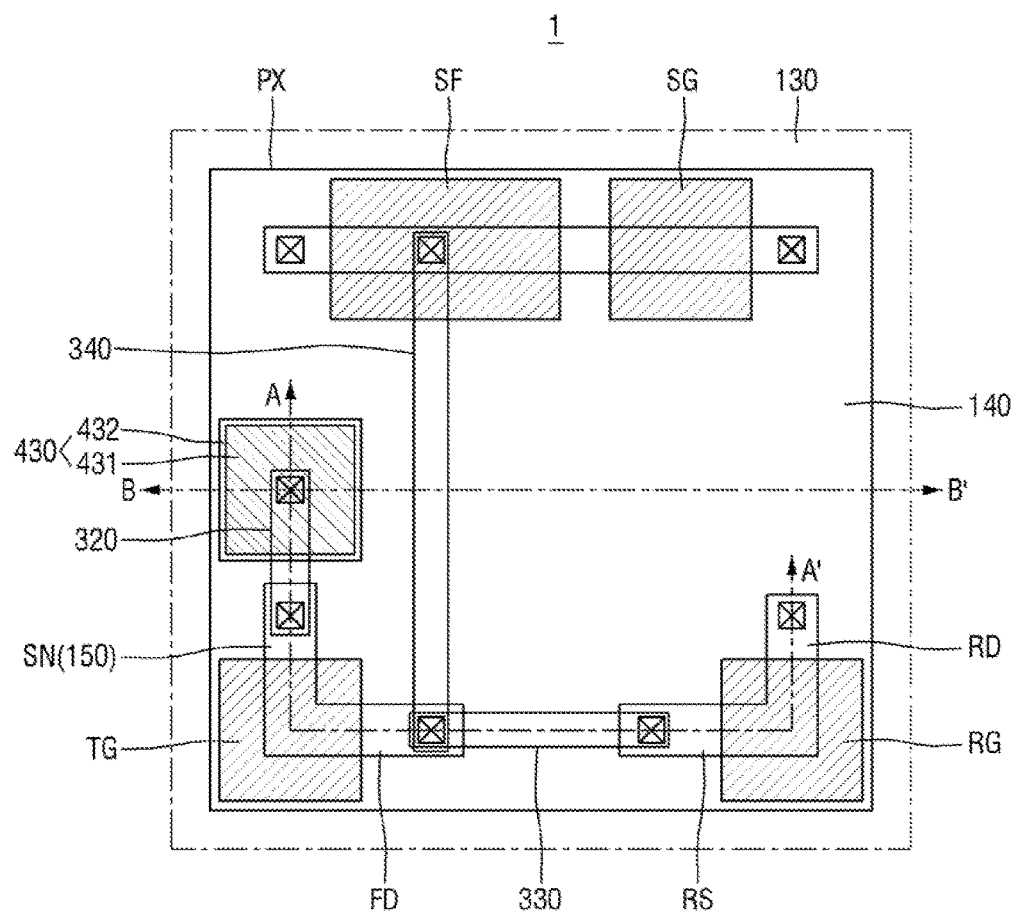
FIG. 6A is a top plan view illustrating the image sensor according to one or more exemplary embodiments of the present inventive concept.

FIG. 6A is a top plan view illustrating the image sensor according to one or more exemplary embodiments of the present inventive concept. FIG. 6B is a cross-sectional view taken along line A-A' of FIG. 6A. FIG. 6C is a cross-sectional view taken along line B-B' of FIG. 6A.

Figure 6B:
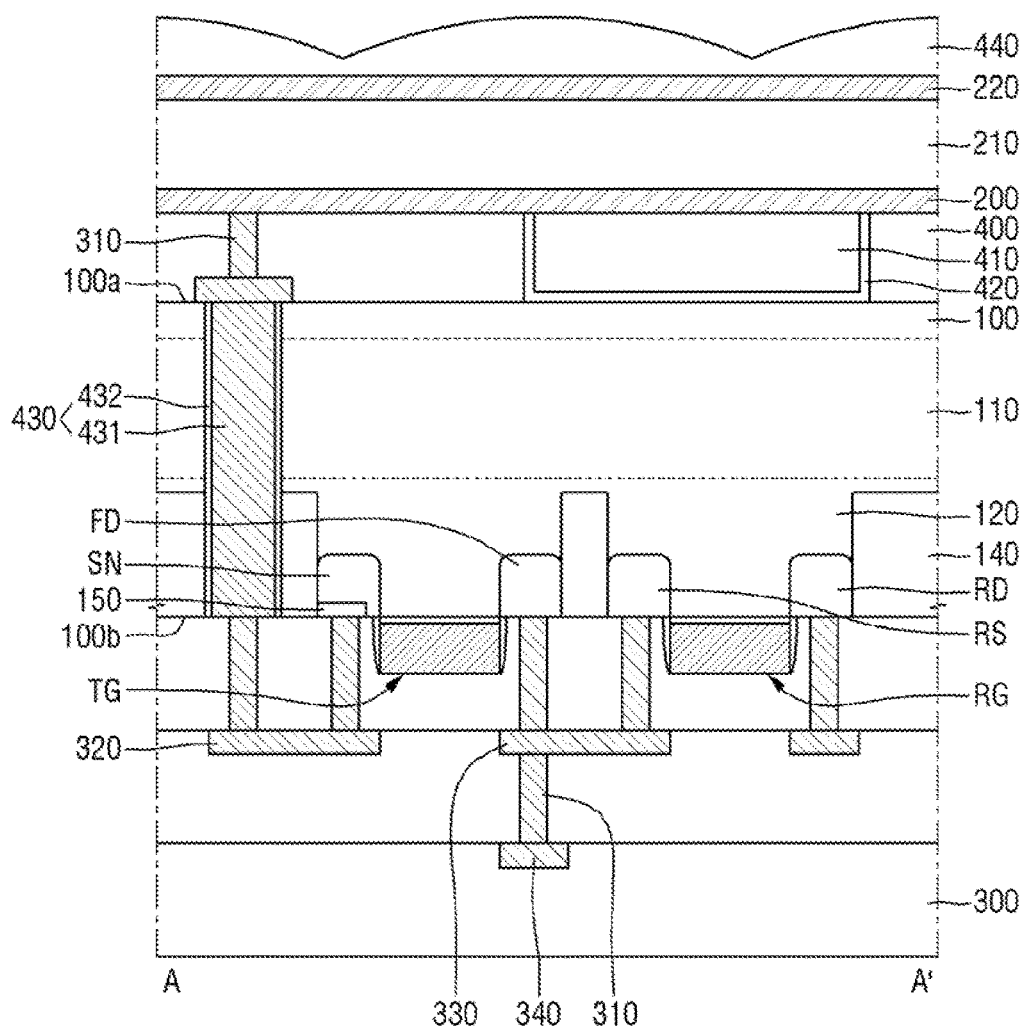
FIG. 6B is a cross-sectional view taken along line A-A' of FIG. 6A according to one or more exemplary embodiments of the present inventive concept.
Figure 6C:
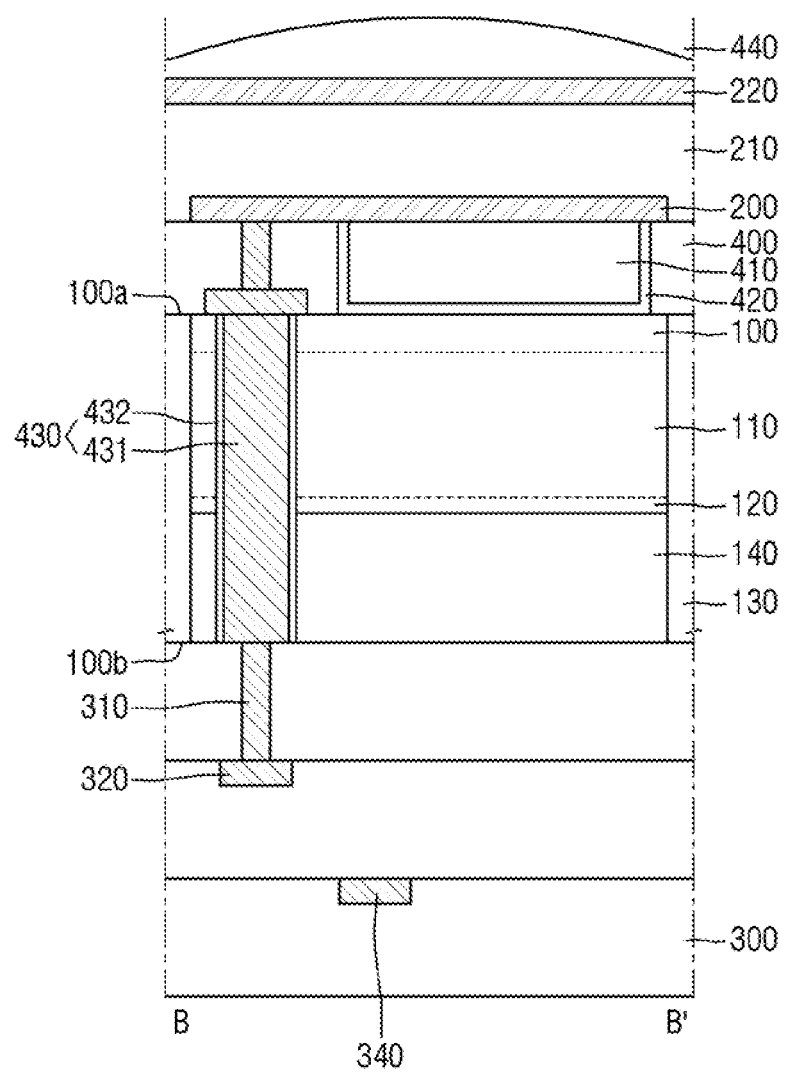
FIG. 6C is a cross-sectional view taken along line B-B' of FIG. 6A according to one or more exemplary embodiments of the present inventive concept.

Referring to FIG. 6A to FIG. 6C, an image sensor 1 may include a pixel PX. The pixel PX may be a part of the plurality of unit pixels arranged two-dimensionally in the active pixel sensor array 10 (of FIG. 1). The active pixel sensor array 10 may be disposed in a substrate 100.

The substrate 100 may include a first surface 100a and a second surface 100b facing each other. The substrate 100 may receive light at the first surface 100a.

Furthermore, the substrate 100 may have a structure in which a base substrate and an epitaxial layer are stacked into a layer. The substrate 100 may be a silicon substrate, a gallium arsenide (GaAs) substrate, a silicon germanium (SiGe) substrate, a ceramic substrate, a quartz substrate, a glass substrate for a display, or the like, and may be a semiconductor-on-insulator (SOI) substrate. However, the present disclosure is not limited thereto.

The pixel PX may include a second photoelectric conversion layer 110, a well impurity layer 120, a first device isolation layer 130, a second device isolation layer 140, a plurality of first interlayer insulation layers 300, a second interlayer insulation layer 400, a lower electrode 200, a first photoelectric conversion layer 210, an upper electrode 220, a color filter 410, an anti-reflection layer 420, a micro lens 440, a through via 430, a storage node region SN, a floating diffusion region FD, a transfer gate TG, a reset source region RS, a reset drain region RD, a reset gate RG, a source follower gate SF, and a selection gate SG.

The second photoelectric conversion layer 110 may be disposed in the substrate 100. The second photoelectric conversion layer 110 may generate photocharges in proportion to a quantity of incident light from the external source. For example, the second photoelectric conversion layer 110 may receive light, and convert the optical signal into the electrical signal.

For example, the second photoelectric conversion layer 110 may generate photocharges by incident light from the external source, and provide a second signal, which is the electrical signal, by using the generated photocharges. The second photoelectric conversion layer 110 may be, for example, a photodiode.

The second photoelectric conversion layer 110 may be formed by doping impurities in the substrate 100. For example, the second photoelectric conversion layer 110 may be formed by ion implanting n-type impurities in the substrate 100. Furthermore, an upper part and a lower part of the second photoelectric conversion layer 110 may have an impurity density difference therebetween, and the second photoelectric conversion layer 110 may have a potential slope. For example, the second photoelectric conversion layer 110 may be formed into a structure in which a plurality of impurity regions is stacked into a layer.

For convenience of explanation, as in FIG. 6A, various transistors connected to the second photoelectric conversion layer 110 so as to process the second signal may not be shown. However, an empty area of the pixel PX shown in FIG. 6A may be used to dispose various transistors for processing the second signal. For example, the empty area of the pixel PX may be used to dispose a transfer transistor, a reset transistor, a drive transistor, or a selection transistor for processing the first or second signal.

The well impurity layer 120 may be disposed beneath the second photoelectric conversion layer 110. In one example, the well impurity layer 120 may be disposed in the substrate 100, and may be formed adjacent to the second surface 100b. The well impurity layer 120 may be formed by doping impurities having a conductivity type opposite to that of the second photoelectric conversion layer 110, in the substrate 100. For example, the well impurity layer 120 may be formed by ion implanting p-type impurities.

The first device isolation layer 130 may be disposed in the region of the active pixel sensor array 10 (in, for example, FIG. 10) so as to define the pixel PX. In one example, the first device isolation layer 130 may enclose the pixel PX, and extend from the first surface 100a to the second surface 100b so as to define the pixel PX in the region of the active pixel sensor array 10.

The first device isolation layer 130 may be formed by patterning the substrate 100 so as to form a deep trench, and then filling the deep trench with an insulation material, as shown in, for example, FIG. 6C. Thus, the first device isolation layer 130 may be formed to extend from the first surface 100a to the second surface 100b. The first device isolation layer 130 may be formed to extend from the first surface 100a to the second surface 100b according to the patterning process, and thus the first device isolation layer 130 may have a shape with a varying width.

The first device isolation layer 130 may be made of an insulation material having a refractive index lower than that of the substrate 100. For example, when the substrate 100 is made of silicon, the first device isolation layer 130 may be made of a silicon oxide layer, a silicon nitride layer, an undoped polysilicon layer, air, or a combination thereof.

Thus, the first device isolation layer 130 may refract incident light which is obliquely incident to the second photoelectric conversion layer 110. The first device isolation layer 130 may prevent photocharges generated in a pixel by the incident light from being transferred to an adjacent pixel region by random drift. In one example, the first device isolation layer 130 may improve light reception rate of the second photoelectric conversion layer 110, thereby improving quality of image data.

The second device isolation layer 140 may be disposed in the pixel PX so as to define an active region. For example, the second device isolation layer 140 may be disposed in the substrate 100, and may be formed adjacent to the second surface 100b, and formed in the well impurity layer 120. Thus, the second device isolation layer 140 may define a region of the well impurity layer 120, in which the second device isolation layer 140 is not formed, as the active region.

The second device isolation layer 140 may be formed by patterning the substrate 100 so as to form a shallow trench, and then filling the shallow trench with the insulation material. For example, the second device isolation layer 140 may be an impurity region having a conductivity type same as that of the well impurity layer 120. In this case, the impurity density in the second device isolation layer 140 may be higher than the impurity density of the well impurity layer 120. In this case, the depth of the second device isolation layer 140 may be shallower than the depth of the first device isolation layer 130. Furthermore, the second device isolation layer 140 may be formed to be spaced apart from the second photoelectric conversion layer 110. For example, the well impurity layer 120 may be formed between the second device isolation layer 140 and the second photoelectric conversion layer 110, as shown in FIG. 6C.

The second device isolation layer 140 may define, for example, a storage node region SN, a floating diffusion region FD, a reset source region RS, and a reset drain region RD in the well impurity layer 120. In one example, the storage node region SN, the floating diffusion region FD, the reset source region RS, and the reset drain region RD may be formed by doping impurities having a conductivity type opposite to that of the well impurity layer 120. For example, the storage node region SN, the floating diffusion region FD, the reset source region RS, and the reset drain region RD may be formed by ion implanting n-type impurities.

The first interlayer insulation layers 300 may be disposed on the second surface 100b, and the second interlayer insulation layer 400 may be disposed on the first surface 100a.

The first and second interlayer insulation layers 300, 400 may be made of the insulation material. For example, the first and second interlayer insulation layers 300, 400 may be made of plasma, tonen silazene (TOSZ), spin on glass (SOG), undoped silica glass (USG), and the like, but the present disclosure is not limited thereto.

As shown in FIG. 6B and FIG. 6C, the lower electrode 200 may be disposed on the first surface 100a. In one example, the lower electrode 200 may be disposed on the first surface 100a in the pixel PX defined by the first device isolation layer 130.

The first photoelectric conversion layer 210 may be disposed on the lower electrode 200. The first photoelectric conversion layer 210 may generate photocharges in proportion to a quantity of incident light from the external source. In one example, the first photoelectric conversion layer 210 may receive light, and convert the optical signal into the electrical signal.

For example, the first photoelectric conversion layer 210 may generate photocharges by incident light from the external source, and provide the first signal, which is the electrical signal, by using the generated photocharges.

The first photoelectric conversion layer 210 may correspond to the photoelectric conversion unit PD as shown in FIG. 2. For example, the first photoelectric conversion layer 210 may include one of the photo diode, the photo transistor, the photo gate, the pinned photo diode (PPD), the organic photo diode (OPD), the quantum dot (QD), and a combination thereof.

The upper electrode 220 may be disposed on the first photoelectric conversion layer 210. In one example, the first photoelectric conversion layer 210 may be interposed between the lower electrode 200 and the upper electrode 220.

The lower electrode 200 and the upper electrode 220 may include a transparent conductive material. For example, the lower electrode 200 and the upper electrode 220 may include indium tin oxide (ITO), zinc oxide (ZnO), tin dioxide (SnO2), antimony-doped tin oxide (ATO), aluminum-doped zinc oxide (AZO), gallium-doped zinc oxide (GZO), titanium dioxide ($TiO_2$), fluorine-doped tin oxide (FTO), or a combination thereof.

The color filter 410 may be disposed on the second photoelectric conversion layer 110. In one example, the color filter 410 may be disposed on the first surface 100a, and interposed between the substrate 100 and the lower electrode 200.

The color filter 410 may include a red color filter, a green color filter, or a blue color filter depending on, for example, the location of a pixel. The color filter 410 may be arranged two-dimensionally, and may include a yellow color filter, a magenta color filter, a cyan color filter, and a white color filter.

The anti-reflection layer 420 may be disposed beneath the color filter 410. In one example, the anti-reflection layer 420 may be disposed on the first surface 100a, and interposed between the substrate 100 and the color filter 410. Furthermore, the anti-reflection layer 420 may conformally cover a lower surface and a side surface of the color filter 410, but the present disclosure is not limited thereto.

The anti-reflection layer 420 may prevent the reflection of incident light from the first surface 100a to an interior of the substrate 100. The anti-reflection layer 420 may be formed into a single layer or multiple layers.

The micro lens 440 may be disposed on the upper electrode 220. The micro lens 440 may have a convex shape, and a predetermined radius of curvature. Thus, the micro lens 440 may condense incident light to the first and second photoelectric conversion layers 110, 210. The micro lens 440 may include, for example, a light-transmitting resin, but the present disclosure is not limited thereto.

In some exemplary embodiments, the first photoelectric conversion layer 210 may absorb light of a green wavelength range so as to generate photocharges, and provide an electrical signal for the light of the green wavelength range, as the first signal.

Thus, light of other wavelength ranges except the light of the green wavelength range may pass the first photoelectric conversion layer 210. For example, incident light which has passed through the micro lens 440 may pass through the upper electrode 220, and light of the green wavelength range, among the passed light, may be absorbed by the first photoelectric conversion layer 210. The light of other wavelength ranges except the light of the green wavelength range may pass through the lower electrode 200.

In some exemplary embodiments, the color filter 410 may include a red color filter or a blue color filter. In this embodiment, the color filter 410 may provide red light or blue light to the second photoelectric conversion layer 110.

Thus, the light passing through the micro lens 440 with the portion of the light of the green wavelength range having been absorbed by the first photoelectric conversion layer 210, may pass through a red color filter or a blue color filter, and provide red or green light to the second photoelectric conversion layer 110. The second photoelectric conversion layer 110 may absorb the light of the red or blue wavelength range so as to generate photocharges, and provide the electrical signal for the light of the red or blue wavelength range, as the second signal.

The through via 430 may penetrate through the substrate 100 to connect the lower electrode 200 and the storage node region SN. In one example, the through via 430 may vertically penetrate through the substrate 100. The through via 430 may include a conductor 431 penetrating through the substrate 100 and extending between the second surface 100b and the first surface 100a, and an insulation layer 432 covering a sidewall of the conductor 431 to insulate the substrate 100 from the conductor 431.

In one embodiment, the conductor 431 may be connected to the lower electrode 200 by a contact 310 disposed in the second interlayer insulation layer 400, and may be connected to the storage node region SN by the contact 310 and a first wiring 320 disposed in the first interlayer insulation layers 300.

In some embodiments, a voltage may be applied to the lower electrode 200 and the upper electrode 220. In one embodiment, the voltage applied to the upper electrode 220 may be higher than the voltage applied to the lower electrode 200. For example, a first voltage may be applied to the lower electrode 200, and a second voltage higher than the first voltage may be applied to the upper electrode 220. Thus, holes among the photocharges generated in the first photoelectric conversion layer 210 may move to the lower electrode 200. For example, the first photoelectric conversion layer 210 may generate holes and provide the first signal.

The storage node region SN and the floating diffusion region FD may be disposed in the substrate 100. In one example, the storage node region SN and the floating diffusion region FD may be formed adjacent to the second surface 100b. In one embodiment, the storage node region SN and the floating diffusion region FD may be spaced apart from each other in the active region defined by the second device isolation layer 140.

The storage node region SN may receive the holes generated by the first photoelectric conversion layer 210 through the through via 430 to store the first signal. For example, the holes provided to the storage node region SN may be recombined with the electrons which have filled the storage node region SN, and thus the first signal can be stored.

In some embodiments, the storage node region SN may include a pinning layer 150 disposed in the substrate 100. In one example, the pinning layer 150 may be disposed in the substrate 100, and may be formed adjacent to the second surface 100b, and connected to the first photoelectric conversion layer 210. The pinning layer 150 may be formed by ion implanting p-type impurities to the storage node region SN which may be formed by ion implanting n-type impurities.

The pinning layer 150 may reduce the dark current generated in the storage node region SN to reduce noise of the image sensor 1. For example, the pinning layer 150 may reduce the dark current which may be generated by a thermal problem at the first surface 100a positioned above the storage node region SN.

The transfer gate TG may be interposed between the storage node region SN and the floating diffusion region FD on the second surface 100b. The transfer gate TG may transfer the first signal from the storage node region SN to the floating diffusion region FD. For example, the transfer gate TG may transfer electrons in the floating diffusion region FD to the storage node region SN.

The reset source region RS and the RD may be disposed in the substrate 100. For example, the reset source region RD and the reset drain region RD may be formed adjacent to the second surface 100b. In one embodiment, the reset source region RS and the reset drain region RD may be spaced apart from each other in the active region defined by the second device isolation layer 140.

The reset source region RS may be electrically connected to the floating diffusion region FD. In one embodiment, the reset source region RS may be electrically connected to the floating diffusion region FD by the contact 310 and a second wiring 330 disposed in the first interlayer insulation layers 300.

The reset gate RG may be interposed between the reset source region RS and the reset drain region RD on the second surface 100b. The reset gate RG may be spaced apart from the transfer gate TG. The reset gate RG may reset the floating diffusion region FD and the storage node region SN. For example, the reset gate RG may transfer electrons from the reset drain region RD to the floating diffusion region FD and the storage node region SN.

In some embodiments, a voltage of about 0.1V to about 1.0V may be applied to the reset drain region RD. In one embodiment, a voltage of about 0.3V to about 0.7V may be applied to the reset drain region RD. As previously described with reference to FIG. 3 to FIG. 5 above, the reset gate RG may control the reset operation in an easier way than when the reset drain voltage $V_{RD}$ is higher than about 0.1V and less than about 0.3V, and the dark current generated in the floating diffusion region FD may be reduced when the reset drain voltage VRD is less than about 0.7V, but the present disclosure is not limited thereto.

The source follower gate SF may be disposed on the second surface 100b. The source follower gate SF may be spaced apart from the transfer gate TG and the reset gate RG as shown in FIG. 6A.

The source follower gate SF may correspond to a gate of the drive transistor DX in FIG. 2. For example, the pixel voltage ($V_{pix}$ in, for example, FIG. 2) may be applied to a drive source region adjacent to the source follower gate SF.

In some embodiments, the drive transistor DX may be a depletion type. In one embodiment, when the voltage applied to the source follower gate SF is about 0V, a channel for charge transfer may be formed between the drive source region and a drive drain region.

For example, the drive transistor DX may have a threshold voltage of substantially equal to 0.5V or lower. In one embodiment, when the voltage applied to the source follower gate SF is substantially equal to 0.5V or lower, a channel for charge transfer may be formed between the drive source region and the drive drain region.

The selection gate SG may be disposed on the second surface 100b. Furthermore, the selection gate SG may be spaced apart from the transfer gate TG, the reset gate RG, and the source follower gate SF as shown in FIG. 6A.

The selection gate SG may correspond to a gate of the selection transistor SX in FIG. 2. In one embodiment, the output voltage ($V_{out}$ in, for example, FIG. 2) may be output from a selection drain region adjacent to the selection gate SG.

Thus, the image sensor 1 according to some exemplary embodiments of the present inventive concept may perform the complete CDS operation by using the transfer transistor. Furthermore, the image sensor 1 may generate holes and provide the electrical signal to control the reset transistor with a reduced voltage. In one embodiment, the dark current generated in the floating diffusion FD region may be substantially reduced. Thus, the image sensor 1 with a targeted function may be provided.

The image sensor according to some exemplary embodiments of the present inventive concept will hereinafter be described with reference to FIG. 7A and FIG. 7B. For convenience of explanation, the part duplicated with those described with reference to FIG. 1 to FIG. 6C will be briefly described or omitted.

Figure 7A:
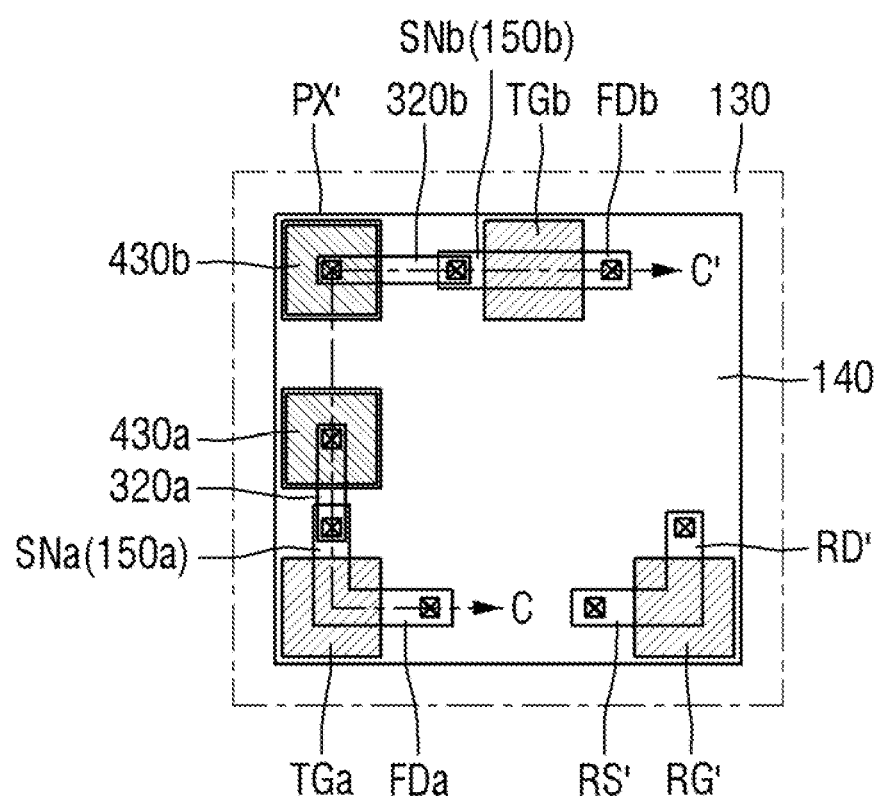
FIG. 7A is a top plan view illustrating the image sensor according to one or more exemplary embodiments of the present inventive concept.

FIG. 7A is a top plan view illustrating the image sensor 2 according to one or more exemplary embodiments of the present inventive concept. FIG. 7B is a cross-sectional view taken along line C-C' of FIG. 7A.

Referring to FIG. 7A, an image sensor 2 may include a pixel PX'. The pixel PX' may correspond to the pixel PX in FIG. 6A.

The pixel PX' may include first and second storage node regions SNa and SNb, first and second floating diffusion regions FDa and FDb, and first and second transfer gates TGa and TGb. In one embodiment, the image sensor 2 may include two transfer gates per one pixel. However, the present disclosure is not limited thereto, and the image sensor 2 may include more than two transfer gates per one pixel.

Furthermore, the pixel PX' may include a reset source region RS', a reset drain region RD', and a reset gate RG'. In one embodiment, while not shown in FIG. 7B, the reset source region RS', a reset drain region RD', and a reset gate RG' may be formed in a similar way to FIG. 6B. In one example, the reset gate RG' may be formed between the reset source region RS' and the reset drain region RD', but the present disclosure is not limited thereto.

For convenience of explanation, a portion of wirings and a portion of logic transistors are not shown in FIG. 7A. However, an empty area of the pixel PX' shown in FIG. 7A may be used to dispose various transistors for processing the first or second signal. For example, the empty area of the pixel PX' may be used to dispose the transfer transistor, the reset transistor, the drive transistor, or the selection transistor for processing the first or second signal.

In some exemplary embodiments, the first and second floating diffusion regions FDa and FDb may be electrically interconnected to form a single floating diffusion region. The first and second floating diffusion regions FDa and FDb may be electrically connected to the reset source region RS' to share the reset gate RG'.

Figure 7B:
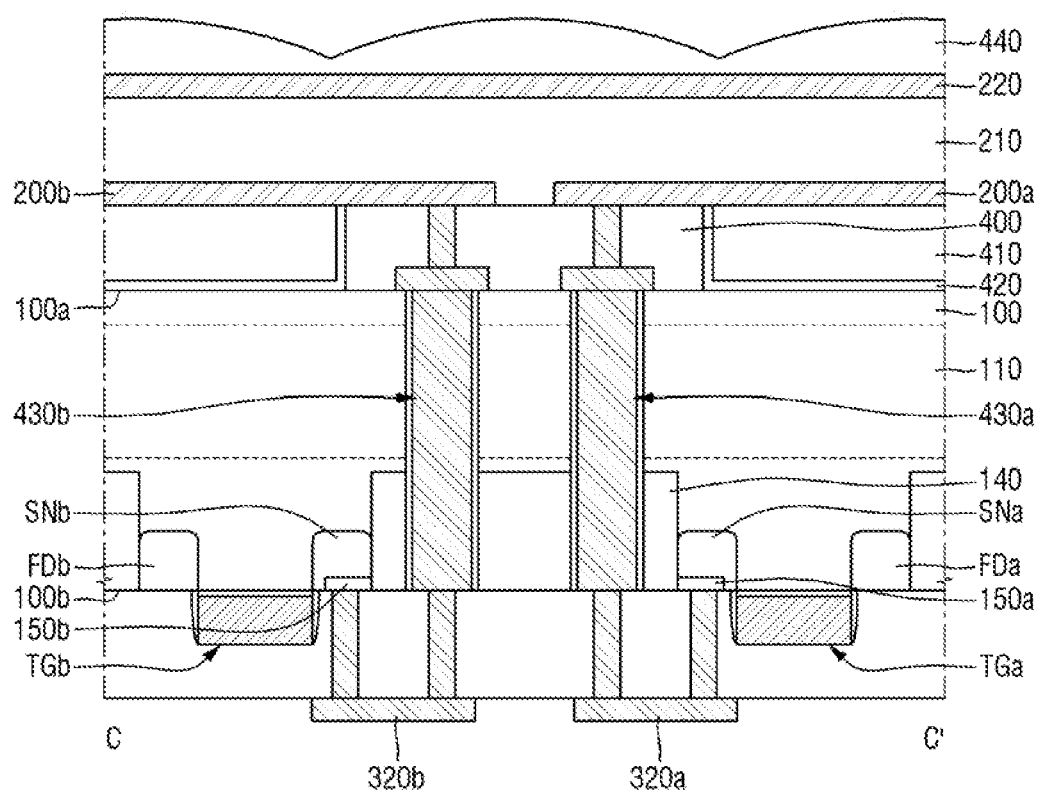
FIG. 7B is a cross-sectional view taken along line C-C' of FIG. 7A according to one or more exemplary embodiments of the present inventive concept.

Referring to FIG. 7B, the pixel PX' may include the first and second lower electrodes 200a and 200b, and first and second through via 430a and 430b.

The first and second lower electrodes 200a and 200b may correspond to the lower electrode 200 in FIG. 6B and FIG. 6C. The first and second through vias 430a and 430b may correspond to the through via 430 in FIG. 6B and FIG. 6C. In this case, the first lower electrode 200a and the second lower electrode 200b may be spaced apart from each other, and the first through via 430a and the second through via 430b may be spaced apart from each other.

In one embodiment, the first through via 430a may connect the first lower electrode 200a and the first storage node region SNa, and the second through via 430b may connect the second lower electrode 200b and the second storage node region SNb.

In some embodiments, a voltage applied to the first lower electrode 200a (hereinafter referred to as "third voltage") and a voltage applied to the second lower electrode 200b (hereinafter referred to as "fourth voltage") may be controlled in different ways.

For example, the fourth voltage may not be applied during the application of the third voltage. In another example, the third voltage may not be applied during application of the fourth voltage. In yet another example, the third voltage and the fourth voltage may be applied at the same time.

When the fourth voltage is not applied during application of the third voltage, only the first photoelectric conversion layer 210 disposed on the first lower electrode 200a may convert the optical signal into the electrical signal (hereinafter referred to as "third signal"). In another embodiment, when the third voltage is not applied during application of the fourth voltage, only the first photoelectric conversion layer 210 disposed on the second lower electrode 200b may convert the optical signal into the electrical signal (hereinafter referred to as "fourth signal"). When the third voltage and the fourth voltage are applied at the same time, substantially the entire first photoelectric conversion layer 210 may convert the optical signal into the electrical signal (hereinafter referred to as "fifth signal").

The image sensor 2 may perform an auto focusing (AF) operation. For example, the image sensor 2 may perform the auto focusing operation by a phase difference detection method using the third to fifth signals.

In one embodiment, the image sensor 2 according to one or more exemplary embodiments of the present inventive concept may be such that the lower electrode is divided, and substantially a plurality of photoelectric conversion units is formed in one pixel. The image sensor 2 may perform the auto focusing operation for each pixel.

However, the present disclosure is not limited thereto, and the image sensor 2 may be configured in that the upper electrode is divided, and substantially a plurality of photo-electric conversion units is formed in one pixel.

Furthermore, the image sensor 2 may control the first transfer gate TGa and the second transfer gate TGb in different ways to form substantially a plurality of photoelectric conversion units in one pixel. For example, the image sensor 2 may transfer the third signal by using the first transfer gate TGa, transfer the fourth signal by using the second transfer gate TGb, and transfer the fifth signal by simultaneously using both the first and second transfer gates TGa and TGb.

The image sensor 2 may perform the complete CDS operation by using the transfer transistor. Furthermore, the image sensor 2 may generate holes and provide the electrical signal to control the reset transistor with a reduced voltage. Thus, the dark current generated in the floating diffusion FD region may be substantially reduced.

An image sensor according to some embodiments of the present inventive concept may hereinafter be described with reference to FIG. 8 and FIG. 9. For convenience of explanation, the part duplicated with those described with reference to FIG. 1 to FIG. 6C will be briefly described or omitted.

Figure 8:
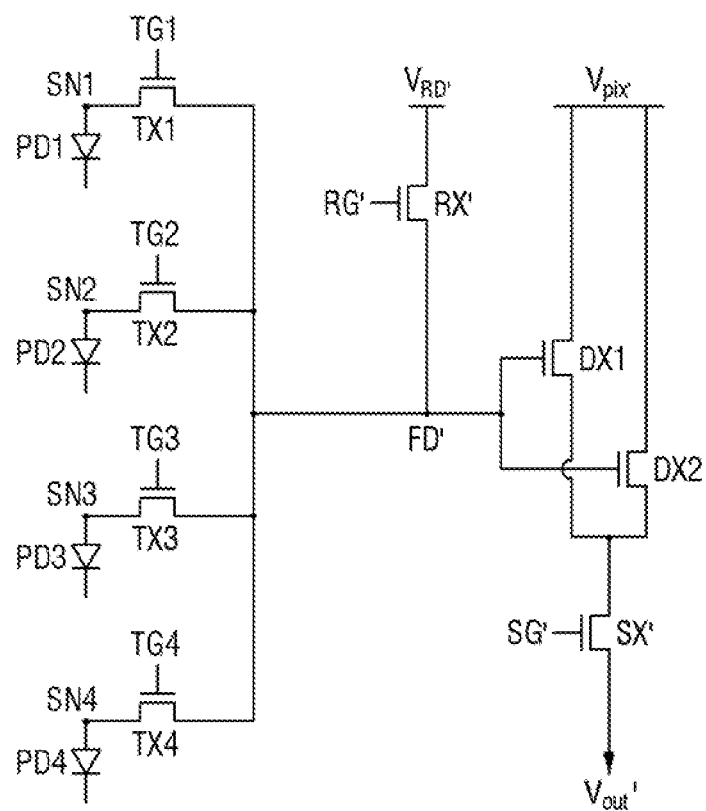
FIG. 8 is a circuit diagram illustrating the image sensor according to one or more embodiments of the present inventive concept.

FIG. 8 is a circuit diagram illustrating the image sensor according to one or more exemplary embodiments of the present inventive concept. FIG. 9 is a top plan view illustrating one or more exemplary embodiments of the image sensor of FIG. 8.

Referring to FIG. 8, a unit pixel of the image sensor according to some exemplary embodiments may include first to fourth photoelectric conversion units PD1 to PD4, first to fourth transfer transistors TX1 to TX4, the reset transistor RX', first and second drive transistors DX1 and DX2, and the selection transistor SX.

The first to fourth photoelectric conversion units PD1 to PD4, the first to fourth transfer transistors TX1 to TX4, the reset transistor RX', the first and second drive transistors DX1 and DX2, and the selection transistor SX may correspond respectively to the photoelectric conversion unit PD, the transfer transistor TX, the reset transistor RX, the drive transistor DX, and the selection transistor SX shown in, for example, FIG. 2.

The first to fourth transfer transistors TX1 to TX4 may include, respectively, the first to fourth storage node regions SN1 to SN4 and first to fourth transfer gates TG1 and TG4. In this case, the first to fourth transfer transistors TX1 to TX4 may share a floating diffusion region FD'.

The first and second drive transistors DX1 and DX2 may amplify voltage variation in the floating diffusion region FD' and generate the amplified voltage variation as an output voltage $V_{out}'$. Although a unit pixel with four photoelectric conversion units, four transfer transistors, and four storage node regions is shown in FIG. 8, the present inventive concept is not limited thereto. For example, a unit pixel of the image sensor may include first to second photoelectric conversion units PD1 and PD2, first to second transfer transistors TX1 and TX2, and first to second storage node regions SN1 and SN2.

Figure 9:
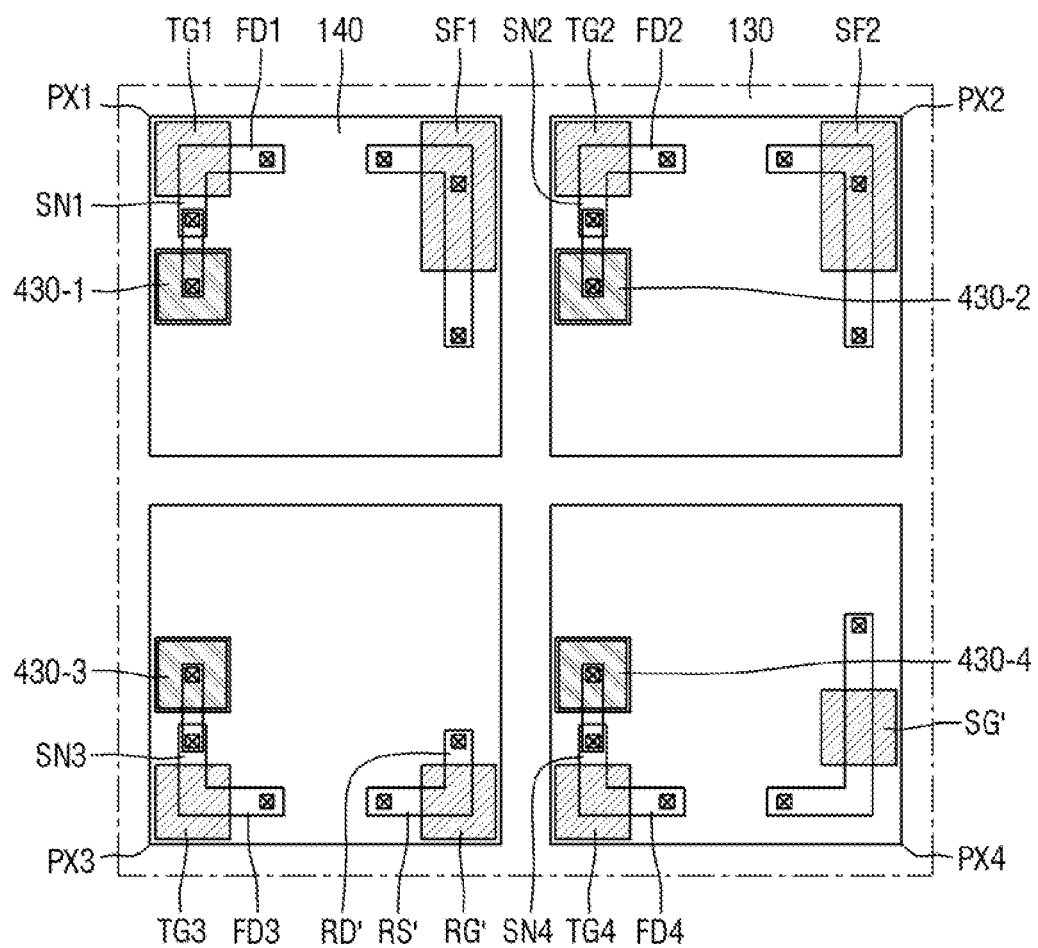
FIG. 9 is a top plan view illustrating some embodiments of the image sensor of FIG. 8 according to one or more exemplary embodiments of the present inventive concept.

Referring to FIG. 9, an image sensor 3 may include the first to fourth pixels PX1 to PX4. The first to fourth pixels PX1 to PX4 may be a part of a plurality of unit pixels arranged two-dimensionally in the active pixel sensor array 10 (in, for example, FIG. 1).

The first to fourth pixels PX1 to PX4 may include respectively first to fourth storage node regions SN1 to SN4, first to fourth floating diffusion regions FD1 to FD4, and the first to fourth transfer gates TG1 to TG4.

In this case, the first pixel PX1 may include a first source follower gate SF1, and the second pixel PX2 may include a second source follower gate SF2. The third pixel PX3 may include the reset drain region RD', the reset source region RS', and the reset gate RG', and the fourth pixel PX4 may include a selection gate SG'.

The first to fourth floating diffusion regions FD1 to FD4 may correspond to the floating diffusion region FD' in FIG. 8. In one embodiment, the first to fourth floating diffusion regions FD1 to FD4 may be electrically interconnected to form a single floating diffusion region.

The first to fourth floating diffusion regions FD1 to FD4 may be electrically connected to the reset source region RS' to share the reset gate RG'. Furthermore, the first to fourth floating diffusion regions FD1 to FD4 may be electrically connected to the first and second source follower gates SF1 and SF2 to share the first and second source follower gates SF1 and SF2 and the selection gate SG'.

In one embodiment, the image sensor 3 according to one or more exemplary embodiments of the present inventive concept may share a floating diffusion region among a plurality of pixels, thereby enabling the image sensor 3 to have a reduced sensor size. In one example, the image sensor 3 may share the floating diffusion region among the plurality of pixels by using the transfer transistor. For example, the first to fourth pixels PX1 to PX4 may share the floating diffusion region, to share the reset gate, the source follower gate, or the selection gate. The image sensor 3 may have an ensured space in a pixel, thereby enabling the pixel to have a reduced size.

The image sensor 3 may perform the complete CDS operation by using the transfer transistor. Furthermore, the image sensor 3 may generate holes and provide the electrical signal to control the reset transistor with a reduced voltage. In one embodiment, the dark current generated in the floating diffusion region may be substantially reduced.

The image sensor 4 according to one or more exemplary embodiments of the present inventive concept will hereinafter be described with reference to FIG. 10. For convenience of explanation, the part duplicated with those described with reference to FIG. 1 to FIG. 9 will be briefly described or omitted.

Figure 10:
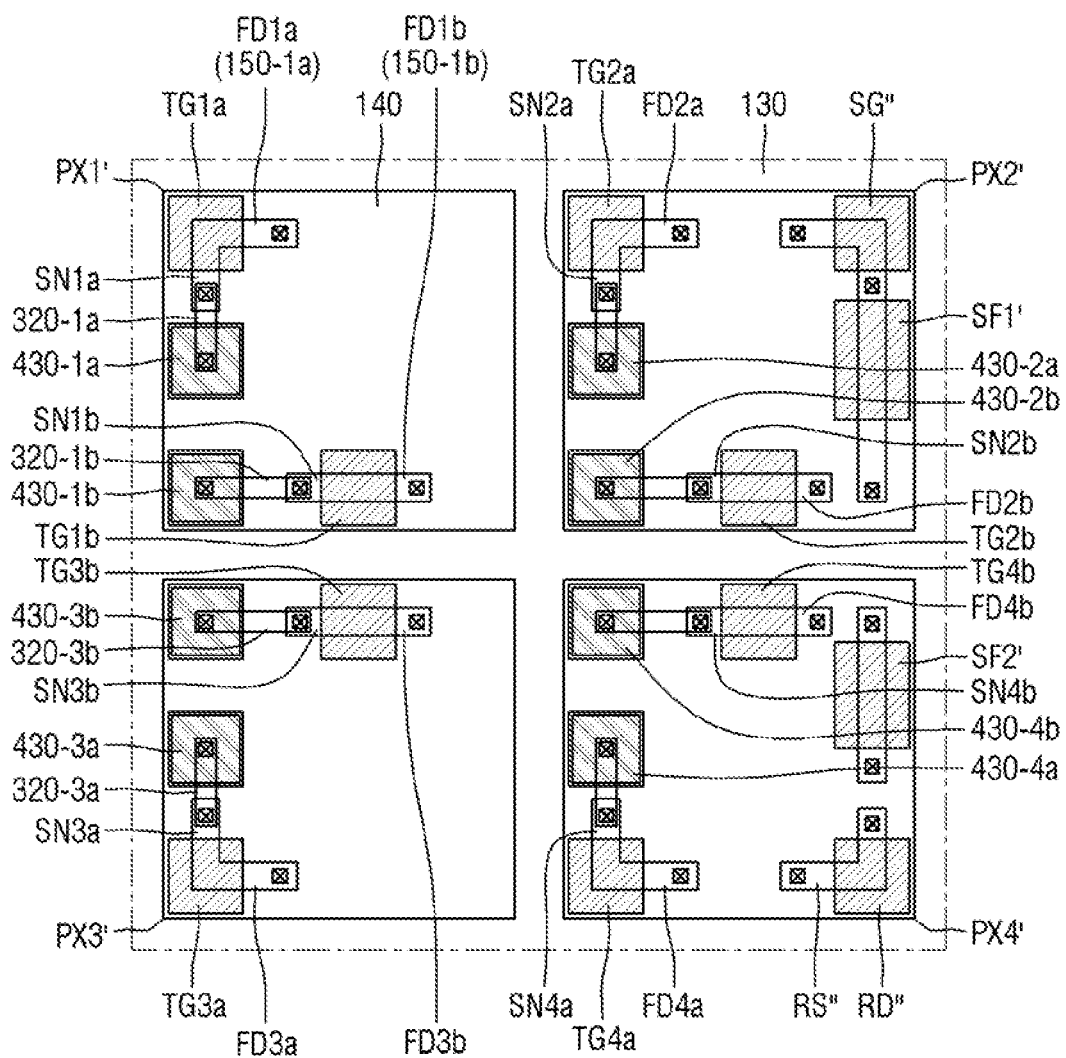
FIG. 10 is a top plan view illustrating the image sensor according to one or more exemplary embodiments of the present inventive concept.

FIG. 10 is a top plan view illustrating the image sensor 4 according to one or more exemplary embodiments of the present inventive concept.

Referring to FIG. 10, an image sensor 4 may include first to fourth pixels PX1' to PX4'. The first to fourth pixels PX1' to PX4' may correspond to the first to fourth pixels PX1 to PX4 in FIG. 9.

The first pixel PX1' may include first and second storage node regions SN1a and SN1b, first and second floating diffusion regions FD1a and FD1b, and first and second transfer gates TG1a and TG1b.

The second pixel PX2' may include third and fourth storage node regions SN2a and SN2b, third and fourth floating diffusion regions FD2a and FD2b, and first and second transfer gates TG2a and TG2b. Furthermore, the second pixel PX2' may include a first source follower gate SF1' and a selection gate SG''.

The third pixel PX3' may include fifth and sixth storage node regions SN3a and SN3b, fifth and sixth floating diffusion regions FD3a and FD3b, and fifth and sixth transfer gates TG3a and TG3b.

The fourth pixel PX4' may include seventh and eighth storage node regions SN4a and SN4b, seventh and eighth floating diffusion regions FD4a and FD4b, and seventh and eighth transfer gates TG4a and TG4b. Furthermore, the fourth pixel PX4' may include a second source follower gate SF2' and a reset gate RG".

Similarly to the first to fourth floating diffusion regions FD1 to FD4 in FIG. 9, the first to eighth floating diffusion regions FD1a to FD4b may be electrically interconnected to form a single floating diffusion region.

Thus, the first to eighth floating diffusion regions FD1a to FD4b may be electrically connected to a reset source region RS" to share the reset gate RG". The first to eighth floating diffusion regions FD1a to FD4b may be electrically connected to the first and second source follower gates SF1' and SF2' to share the first and second source follower gates SF1' and SF2' and the selection gate SG" among the first to eighth floating diffusion regions FD1a to FD4b.

Similarly to the pixel PX' in FIG. 7A, each of the first to fourth pixels PX1' to PX4' may include two transfer gates. In one embodiment, the image sensor 4 may include two transfer gates per one pixel. However, the present disclosure is not limited thereto, and the image sensor 4 may include more transfer gates per one pixel.

Thus, as described with reference to FIG. 7A and FIG. 7B above, the image sensor 4 may perform an auto focusing (AF) operation. For example, the image sensor 4 may perform the auto focusing operation by the phase difference detection method.

The image sensor 4 may perform the complete CDS operation by using the transfer transistor. Furthermore, the image sensor 4 may generate holes and provide the electrical signal to control the reset transistor with a reduced voltage. In one embodiment, the dark current generated in the floating diffusion region may be substantially reduced.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. An image sensor comprising:
an active pixel sensor array including a first pixel; and
a substrate on which the active pixel sensor array is disposed,
wherein the substrate includes a first surface and a second surface facing each other, and wherein the substrate is configured to receive light at the second surface, and the first pixel includes:
a first lower electrode disposed on the second surface, and configured to receive a first voltage;
a first photoelectric conversion layer disposed on the first lower electrode;
an upper electrode disposed on the first photoelectric conversion layer, and configured to receive a second voltage that is higher than the first voltage;
a first storage node region, a first floating diffusion region, a reset source region, and a reset drain region that are disposed in the substrate and adjacent to the first surface, wherein the first storage node region and the first floating diffusion region include n-type impurities, and wherein the first storage node region includes a pinning layer which is connected to the first photoelectric conversion layer and which includes p-type impurities;
a first transfer gate disposed on the first surface, and interposed between the first storage node region and the first floating diffusion region;
a reset gate disposed on the first surface, and interposed between the reset source region and the reset drain region; and
a first through via which is disposed through the substrate, and configured to electrically connect the first lower electrode and the first storage node region,
wherein the reset source region is electrically connected to the first floating diffusion region, and
a reset drain voltage ranging from about 0.1V to about 1.0V is applied to the reset drain region.

2. The image sensor of claim 1, wherein the first pixel further includes a second photoelectric conversion layer which is disposed in the substrate.

3. The image sensor of claim 1, wherein the reset drain voltage ranges from about 0.3V to about 0.7V.

4. The image sensor of claim 1, wherein the first pixel further includes a source follower gate which is spaced apart from the first transfer gate on the first surface, and the source follower gate is configured to electrically connect to the first floating diffusion region.

5. The image sensor of claim 1, wherein the first pixel further includes:
a second lower electrode which is spaced apart from the first lower electrode on the second surface, and configured to receive a third voltage that is lower than the second voltage;
a second storage node region and a second floating diffusion region that are disposed in the substrate, adjacent to the first surface, and spaced apart from the first storage node region and the first floating diffusion region;
a second transfer gate disposed on the first surface, and interposed between the second storage node region and the second floating diffusion region; and
a second through via disposed vertically through the substrate, connecting the second lower electrode with the second storage node region.

6. The image sensor of claim 1, wherein the active pixel sensor array further includes a second pixel spaced apart from the first pixel, and
the second pixel includes:
a second storage node region and a second floating diffusion region that are disposed in the substrate, adjacent to the first surface; and
a second transfer gate disposed on the first surface, and interposed between the second storage node region and the second floating diffusion region,
wherein the second floating diffusion region is electrically connected to the first floating diffusion region.

* * * * *